United States Patent
Ohaga et al.

(10) Patent No.: US 7,996,969 B2
(45) Date of Patent: Aug. 16, 2011

(54) METHOD FOR ADJUSTING CAPACITANCE VALUE OF BUILT-IN CAPACITOR IN MULTILAYER CERAMIC SUBSTRATE, AND METHOD FOR MANUFACTURING A MULTILAYER CERAMIC SUBSTRATE

(75) Inventors: Satoshi Ohaga, Yasu (JP); Yasutaka Sugimoto, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 268 days.

(21) Appl. No.: 12/181,441

(22) Filed: Jul. 29, 2008

(65) Prior Publication Data
US 2008/0297978 A1   Dec. 4, 2008

Related U.S. Application Data

(63) Continuation of application No. PCT/JP2006/323149, filed on Nov. 21, 2006.

(30) Foreign Application Priority Data

Jan. 30, 2006  (JP) ................................ 2006-021218

(51) Int. Cl.
*H01G 13/00* (2006.01)
(52) U.S. Cl. ........ 29/25.42; 29/25.41; 29/593; 361/184; 361/303
(58) Field of Classification Search ...... 29/25.41–25.42, 29/830–832, 846–847, 593; 219/121.65; 361/271, 306.2, 390, 310, 372, 184, 321.2
See application file for complete search history.

(56) References Cited

U.S. PATENT DOCUMENTS

| | | | | |
|---|---|---|---|---|
| 4,338,506 A | * | 7/1982 | Geller et al. | 219/121.65 |
| 5,157,582 A | * | 10/1992 | Sugita et al. | 361/321.1 |
| 5,814,366 A | | 9/1998 | Fukuta et al. | |
| 6,002,576 A | * | 12/1999 | Asakura et al. | 361/311 |
| 6,107,228 A | | 8/2000 | Sugimoto et al. | |
| 6,602,616 B2 | | 8/2003 | Sugimoto et al. | |
| 6,664,481 B1 | * | 12/2003 | Olofsson | 174/260 |
| 7,059,195 B1 | * | 6/2006 | Liu et al. | 73/753 |
| 7,091,147 B2 | * | 8/2006 | Oobuchi et al. | 501/139 |
| 2002/0037804 A1 | | 3/2002 | Sugimoto et al. | |

(Continued)

FOREIGN PATENT DOCUMENTS

EP  1 517 596 A2  3/2005

(Continued)

OTHER PUBLICATIONS

Official Communication issued in International Patent Application No. PCT/JP2006/323149, mailed on Feb. 20, 2007.

(Continued)

*Primary Examiner* — Minh Trinh
(74) *Attorney, Agent, or Firm* — Keating & Bennett, LLP

(57) ABSTRACT

In a multilayer ceramic substrate having a built-in capacitor provided in a ceramic laminate including a plurality of ceramic layers laminated to each other, the built-in capacitor being formed of a first capacitor electrode, a second capacitor electrode, and one of the dielectric glass ceramic layers, the capacitance value of the built-in capacitor is adjusted by performing laser trimming of the first capacitor electrode. The one dielectric glass ceramic layer is made of a $TiO_2$-based dielectric glass ceramic layer in which the amount of dielectric grains including $TiO_2$ is about 10 percent to about 35 percent by volume.

8 Claims, 5 Drawing Sheets

U.S. PATENT DOCUMENTS

| | | |
|---|---|---|
| 2004/0144476 A1 | 7/2004 | Fukuta et al. |
| 2007/0036996 A1 | 2/2007 | Sugimoto et al. |

FOREIGN PATENT DOCUMENTS

| | | |
|---|---|---|
| JP | 10-055933 A | 2/1998 |
| JP | 11-310455 A | 11/1999 |
| JP | 2000-58381 A | 2/2000 |
| JP | 2002-97072 A | 4/2002 |
| JP | 2003-277149 A | 10/2003 |
| JP | 2004-311534 A | 11/2004 |
| JP | 2005-217170 A | 8/2005 |
| JP | 2005-328396 A | 11/2005 |
| WO | 2005/082806 A1 | 9/2005 |

OTHER PUBLICATIONS

Official Communication issued in corresponding Japanese Patent Application No. 2007-555856, mailed on Oct. 5, 2010.

Official Communication issued in corresponding European Patent Application No. 06832999.4, mailed on Nov. 8, 2010.

* cited by examiner

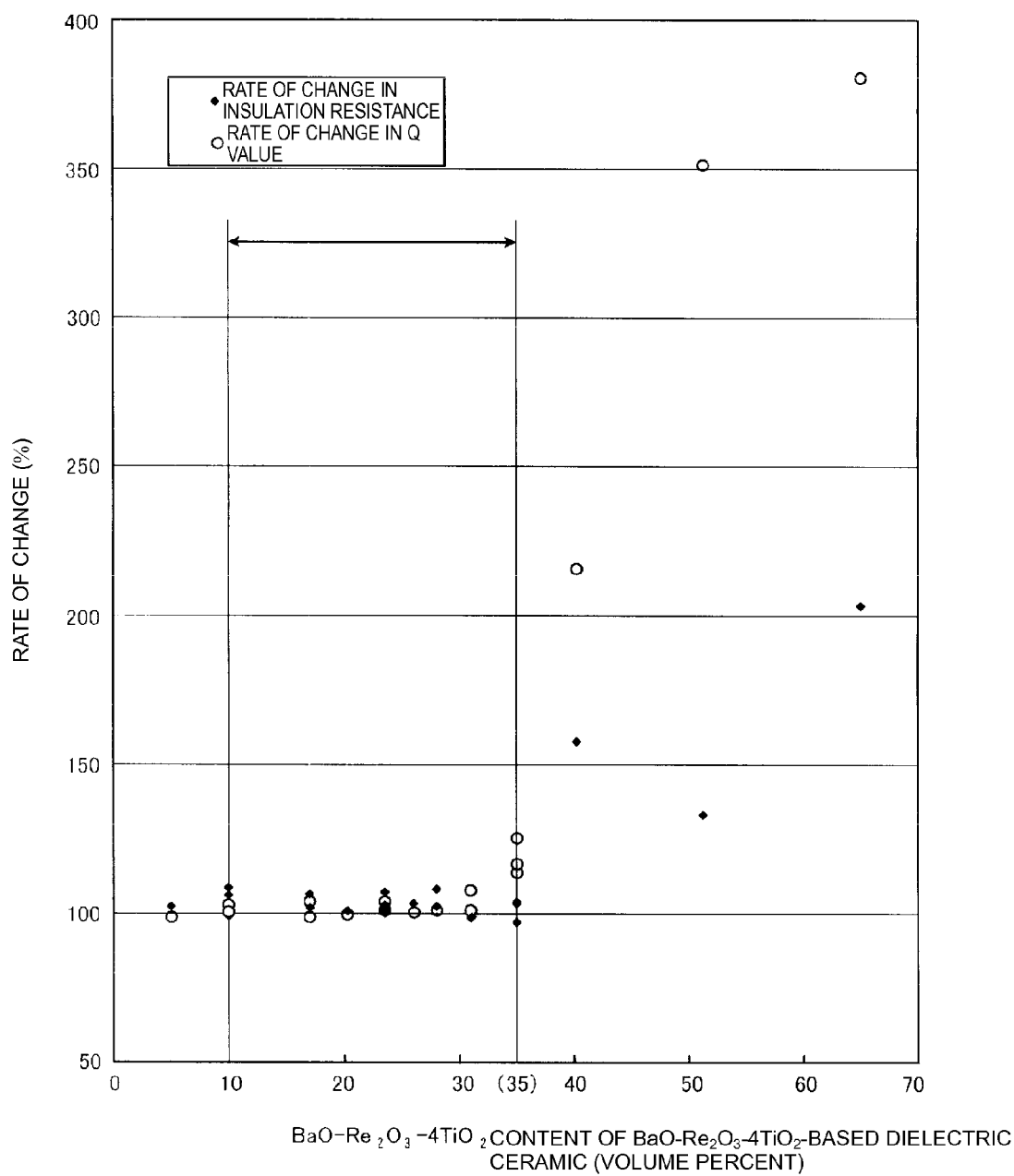

METHOD FOR ADJUSTING CAPACITANCE VALUE OF BUILT-IN CAPACITOR IN MULTILAYER CERAMIC SUBSTRATE, AND METHOD FOR MANUFACTURING A MULTILAYER CERAMIC SUBSTRATE

BACKGROUND OF THE INVENTION

1. Field of the Invention

The present invention relates to a method for adjusting the capacitance value of a capacitor that is built in a multilayer ceramic substrate, a multilayer ceramic substrate, and a method for manufacturing the same, and more particularly, to a method for adjusting the capacitance value of a built-in capacitor by laser trimming.

2. Description of the Related Art

In information processing apparatuses, such as a mobile communication terminal and a personal computer, for example, an increase in information processing speed, miniaturization of the apparatus, and improvement of multifunctionality have been actively pursued, and the improvement in the performance of the information processing apparatuses as described above has been achieved primarily by an increase in integration, an increase in processing speed, and an improvement of functionality of semiconductor devices, such as VLSI and ULSI.

However, even though the increase in processing speed and the improvement of functionality of semiconductor devices have been accomplished, signal delay, crosstalk, impedance mismatching, noise generation caused by fluctuation of power source output, and other problems may occur on a substrate on which devices are connected to each other. As a result, the system performance may be limited.

Accordingly, as an electronic component used in a high speed and high performance information processing apparatus, a multichip module (MCM: Multi-Chip Module) in which a plurality of semiconductor devices is mounted on a ceramic substrate has been used. A multilayer ceramic substrate is provided on which a wiring pattern for electrically connecting semiconductor devices in a three-dimensional manner is disposed, and alumina has been used for this type of multilayer ceramic substrate.

In a multilayer ceramic substrate using alumina, since a sintering temperature of an alumina powder is relatively high, such as about 1,500° C. or more, a high melting point metal, such as tungsten or molybdenum, must be used for an inner layer wiring pattern. However, since the high melting point metals as described above have a high specific resistance, signal loss increases, particularly in a high frequency region.

In order to solve this problem, a multilayer ceramic substrate has been developed which is formed by laminating a plurality of glass ceramic green sheets, followed by sintering. Since the glass ceramic green sheets are formed by adding a vehicle including a binder, a solvent, and other suitable ingredients to a ceramic powder and a glass powder, followed by mixing, and the sintering temperature is about 1,050° C. or less, simultaneous firing can be performed with a low temperature melting point metal, such as silver or copper, having a low specific resistance, and a multilayer ceramic substrate having a small signal loss in a high frequency region and superior electrical properties can be obtained.

In addition, recently, an attempt has been made in which a passive element, such as a capacitor, surface mounted on a multilayer ceramic substrate is built in a multilayer ceramic substrate so that the entire module is further miniaturized.

In a situation in which the element as described above is built in a multilayer ceramic substrate, when the electrical properties of the element are degraded as compared to that of a surface mounting element mounted on a substrate surface, the advantage obtained by a built-in element is reduced by approximately half. Thus, a built-in element must have properties equal to or greater than those of an element mounted on a substrate. Thus, a substrate base material is selected so that sufficient electrical properties of each built-in element can be obtained.

For example, in Japanese Unexamined Patent Application Publications Nos. 9-92983 and 2000-58381, a capacitor-built-in multilayer ceramic substrate is disclosed which has a structure in which a capacitor is built in, and a dielectric ceramic layer having a high dielectric constant is provided between capacitor electrodes so as to define the capacitor. As described above, when a dielectric ceramic layer having a high dielectric constant is provided between capacitor electrodes, even if the areas of capacitor electrodes are relatively small, a built-in capacitor having a high capacitance is provided.

The capacitance value of a capacitor built in a multilayer ceramic substrate may vary lot by lot because of, for example, variations in the thickness of the ceramic green sheets, variations in the printed area of the capacitor electrodes, variations generated when ceramic green sheets are laminated to each other, and variations in shrinkage which occurs when the ceramic green sheets are fired. Accordingly, in order to achieve a highly precise capacitance value of a built-in capacitor, it is necessary to perform trimming of a capacitor electrode with a laser or other suitable method. That is, by milling the area of a capacitor electrode using laser trimming, the capacitance value of a built-in capacitor can be set to a desired value.

However, when laser trimming is performed, a dielectric ceramic layer provided between capacitor electrodes is partially milled in addition to the capacitor electrode, and as a result, after the trimming is performed, the insulation resistance between the capacitor electrodes may be decreased and/or the Q value of the capacitor may be decreased in some cases.

SUMMARY OF THE INVENTION

To overcome the problems described above, preferred embodiments of the present invention provide a method for adjusting the capacitance value of a built-in capacitor, which precisely adjusts the capacitance value of a built-in capacitor without significantly changing the insulation resistance and Q value before and after laser trimming, a multilayer ceramic substrate obtained by using the method for adjusting the capacitance value of a built-in capacitor, and a method for manufacturing a multilayer ceramic substrate, which is performed using the method for adjusting the capacitance value of a built-in capacitor.

A method for adjusting the capacitance value of a built-in capacitor of a multilayer ceramic substrate according to a preferred embodiment of the present invention includes a ceramic laminate having a plurality of ceramic layers laminated to each other, and first and second capacitor electrodes arranged to face each other with one of the ceramic layers interposed therebetween so as to define the built-in capacitor.

The method for adjusting the capacitance value of a built-in capacitor, according to this preferred embodiment of the present invention, includes the step of performing laser trimming the first capacitor electrode, and the specific ceramic layer disposed between the first and the second electrodes is a TiO$_2$-based dielectric glass ceramic layer which includes about 10 percent to about 35 percent by volume of dielectric grains including TiO$_2$.

The TiO$_2$-based dielectric glass ceramic layer preferably has a layer thickness of about 12.5 μm to about 50 μm, for example.

Both of the first and second capacitor electrodes may be built in the ceramic laminate.

The TiO$_2$-based dielectric glass ceramic layer preferably includes:

(A) about 10 percent to about 35 percent by volume of a BaO—TiO$_2$—ReO$_{3/2}$-based ceramic represented by xBaO-yTiO$_2$-zReO$_{3/2}$ (where x, y, and z each indicate molar percent; $8 \leq x \leq 18$, $52.5 \leq y \leq 65$, and $20 \leq z \leq 40$ is maintained; x+y+z=100 is maintained; and Re indicates a rare earth element);

(B) about 5 percent to about 42 percent by volume of an alumina ceramic; and (C) about 50 percent to about 79 percent by volume of a borosilicate glass which includes about 4 percent to about 17.5 percent by weight of B$_2$O$_3$, about 28 percent to about 50 percent by weight of SiO$_2$, about 0 percent to about 20 percent by weight of Al$_2$O$_3$, and about 36 percent to about 50 percent by weight of MO (where MO is at least one selected from the group consisting of CaO, MgO, SrO, and BaO), and in addition, the TiO$_2$-based dielectric glass ceramic layer is preferably formed by firing a glass ceramic composition including the BaO—TiO$_2$—ReO$_{3/2}$-based ceramic and the alumina ceramic in a total amount of about 21 percent by volume or more.

In the above-described glass ceramic composition, the borosilicate glass may further include less than about 0.5 percent by weight of at least one selected from the group consisting of Li$_2$O, Na$_2$O, and K$_2$O.

A method for manufacturing a multilayer ceramic substrate according to another preferred embodiment of the present invention includes the steps of forming a multilayer ceramic substrate before being processed by trimming, which includes a ceramic laminate having a plurality of ceramic layers laminated to each other, and first and second capacitor electrodes arranged to face each other with one of the ceramic layers interposed therebetween so as to define a built-in capacitor, and performing laser trimming of the first capacitor electrode in order to adjust the capacitance value of the built-in capacitor.

In the step of forming a multilayer ceramic substrate before being processed by trimming, the specific ceramic layer located between the first and the second capacitor electrodes may be formed of a TiO$_2$-based dielectric glass ceramic layer in which the content of dielectric grains including TiO$_2$ is about 10 percent to about 35 percent by volume.

A multilayer ceramic substrate according to another preferred embodiment of the present invention includes a ceramic laminate having a plurality of ceramic layers laminated to each other and first and second capacitor electrode arranged to face each other with one of the ceramic layers interposed therebetween so as to define a built-in capacitor.

The ceramic layer located between the first and second capacitor electrodes may be a TiO$_2$-based dielectric glass ceramic layer in which the content of dielectric grains including TiO$_2$ is about 10 percent to about 35 percent by volume, and the first capacitor electrode may have a trimming track provided when the built-in capacitor is processed by laser trimming.

In the method for adjusting the capacitance value of a built-in capacitor according to preferred embodiments of the present invention, when the first capacitor electrode is processed by laser trimming in order to adjust the capacitance value of a built-in capacitor, since the ceramic layer provided between the first and the second capacitor electrodes is a TiO$_2$-based dielectric glass ceramic layer in which the content of the dielectric grains (hereinafter referred to as "TiO$_2$-based dielectric grains" in some cases) including TiO$_2$ is about 10 percent to about 35 percent by volume, the insulation resistance between the capacitor electrodes and the Q value of the capacitor are not significantly changed after the laser trimming, and the capacitance value of the built-in capacitor can be precisely adjusted.

That is, changes in insulation resistance and Q value are caused by changes in the properties, which are caused by the laser trimming, of the dielectric glass ceramic layer between the capacitor electrodes and are particularly caused by semiconductorization of the TiO$_2$-based dielectric grains of the dielectric glass ceramic layer. Thus, by specifying the ratio (volume ratio) of the TiO$_2$-based grains which are responsible for the changes in the properties, without substantially degrading the insulation resistance and the Q value, the capacitance value of the built-in capacitor can be precisely adjusted.

In the method for manufacturing a multilayer ceramic substrate according to a preferred embodiment of the present invention, when the method for adjusting the capacitance value of a built-in capacitor is used, a multilayer ceramic substrate which includes a built-in capacitor having a superior insulation resistance and Q value can be manufactured with outstanding reproducibility.

The multilayer ceramic substrate according to a preferred embodiment of the present invention is obtained by using the method for adjusting the capacitance value of a built-in capacitor according to a preferred embodiment of the present invention. Thus, the capacitance value of the built-in capacitor can be precisely adjusted, and the insulation reliability and the Q value are greatly improved.

Other features, elements, characteristics, and advantages of the present invention will become more apparent from the following detailed description of preferred embodiments of the present invention with reference to the attached drawings.

BRIEF DESCRIPTION OF THE DRAWINGS

FIG. 6 is a graph showing the rate of change in insulation resistance and the rate of change in Q value with respect to the content (volume percent) of a BaO—Re$_2$O$_3$-4TiO$_2$-based dielectric glass ceramic.

DETAILED DESCRIPTION OF PREFERRED EMBODIMENTS

Figure 1A:
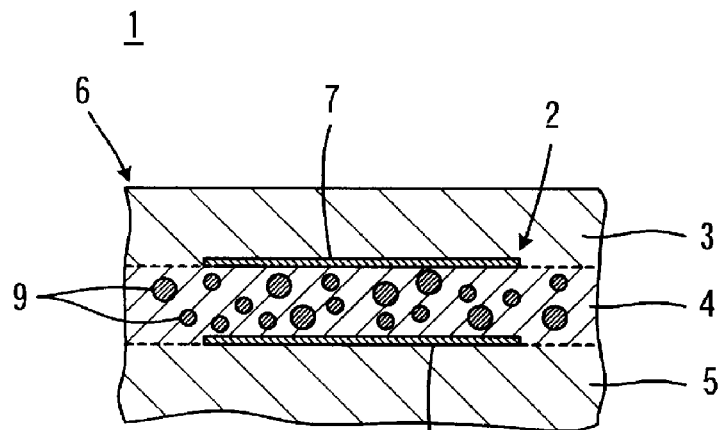
FIGS. 1A to 1C are cross-sectional views showing a portion of a multilayer ceramic substrate for illustrating a method for adjusting the capacitance value of a built-in capacitor according to a preferred embodiment of the present invention.
Figure 1B:
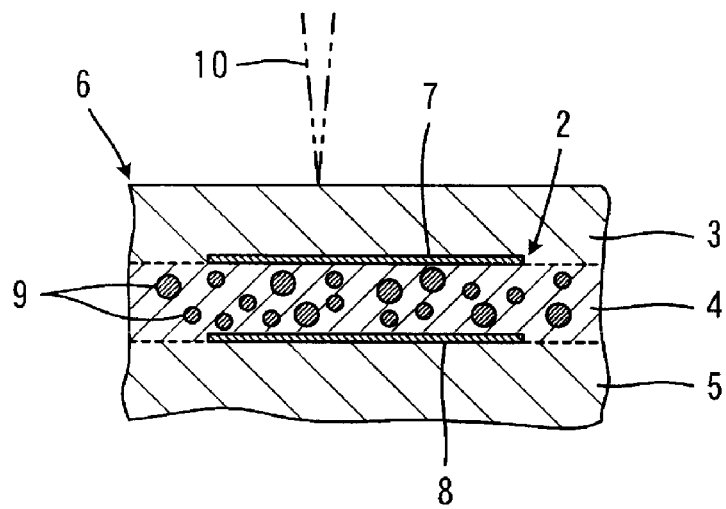
Figure 1C:
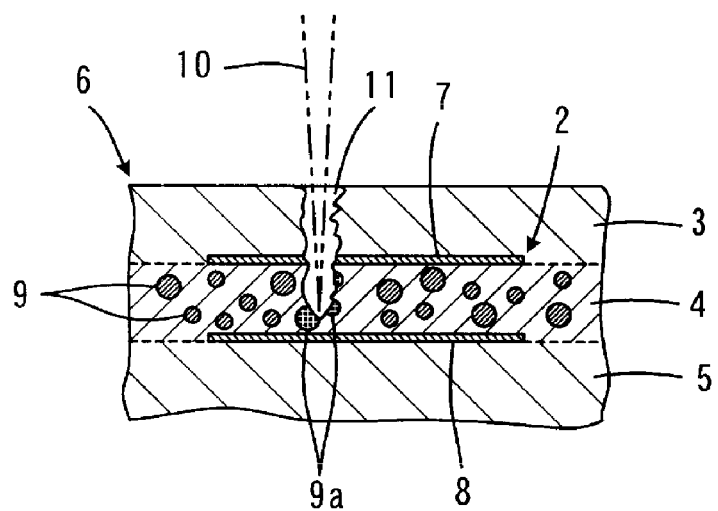

First, with reference to FIGS. 1A to 1C, a method for adjusting the capacitance value of a built-in capacitor according to a preferred embodiment of the present invention will be described in detail. In FIGS. 1A to 1C, schematic cross-sectional views are shown indicating a portion of a multilayer ceramic substrate 1 in which a built-in capacitor 2 is formed.

As shown in FIG. 1A, the multilayer ceramic substrate 1 has a ceramic laminate 6 including ceramic layers 3, 4, and 5 laminated to each other, and in the ceramic laminate 6, the built-in capacitor 2 is formed. The built-in capacitor 2 includes a first capacitor electrode 7, a second capacitor electrode 8 arranged to face the first capacitor electrode 7, and the ceramic layer 4 provided between the first and second capacitor electrodes 7 and 8. The ceramic layer 4 is a dielectric glass ceramic layer and is a dielectric layer including $TiO_2$-based dielectric grains 9, and the ratio of the $TiO_2$-based grains 9 is set to about 10 percent to about 35 percent by volume.

The capacitance value of the capacitor 2 built in the multilayer ceramic substrate 1 may vary lot to lot because of, for example, variations in the thickness of a ceramic green layer to be formed into the glass ceramic layer 4, variations in the screen printed area of conductor patterns to be formed into the first and the second capacitor electrodes 7 and 8, variations generated when ceramic green sheets are laminated to each other, and variations in shrinkage which occurs when the ceramic green sheets are fired. Accordingly, in order to set the capacitance value of the built-in capacitor 2 to a desired value, as shown in FIG. 1B, by using YAG (Yttrium Aluminum Garnet) laser or other suitable laser, laser light 10 is irradiated on the first capacitor electrode 7 in the ceramic laminate 6 provided in the multilayer ceramic substrate 1.

Accordingly, as shown in FIG. 1C, the first capacitor electrode 7 is milled together with the ceramic layer 3 by the laser light 10, and a processed hole (trimming track) 11 is formed. As a result, a portion of the first capacitor electrode 7 is milled, and in addition, in this step, the processed hole 11 extends to a portion of the dielectric glass ceramic layer 4. Thus, the dielectric glass ceramic layer 4 is also partially milled.

In this preferred embodiment, a dielectric glass ceramic layer 4 having a high dielectric constant is made, for example, of a titanium oxide-based material, such as barium titanate, calcium titanate, or strontium titanate, and in the above materials, a titanium oxide-based crystalline phase ($TiO_2$-based dielectric grains), such as a $BaTiO_3$ crystalline phase, a $CaTiO_3$ crystalline phase, or a $SrTiO_3$ crystalline phase, is a primary crystalline phase. In addition, since heat generated by the irradiation of the laser light 10 instantaneously reaches about 2,000° C., when this heat is applied to the $TiO_2$-based dielectric grains 9 in the dielectric glass ceramic layer 4, tetravalent titanium forming the $TiO_2$-based dielectric grains 9 is reduced to trivalent titanium ($Ti^{4+} \rightarrow Ti^{3+}$).

As a result, oxygen holes are formed in the dielectric grains 9, and the dielectric grains 9 are semiconductorized. That is, by the laser trimming, a portion of the $TiO_2$-based dielectric grains 9, which is in the vicinity of the portion that is irradiated with the laser light 10, is changed to semiconductorized $TiO_2$-based dielectric grains 9a.

As for the above semiconductorization, according to preferred embodiments of the present invention, since the ratio of the $TiO_2$-based dielectric grains 9 in the $TiO_2$-based dielectric glass ceramic layer 4 is low, such as about 10 percent to about 35 percent by volume, even when the $TiO_2$-based dielectric grains 9 are semiconductorized, the semiconductorized dielectric grains 9a are not connected to each other between the first capacitor electrode 7 and the second capacitor electrode 8 as shown in FIG. 1C. Thus, even after the laser trimming, the insulation resistance and the Q value are not substantially decreased.

Figure 2:
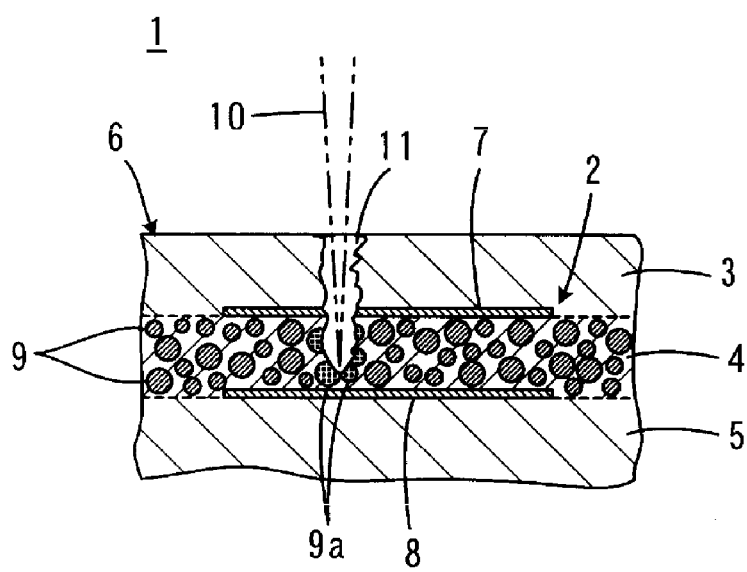
FIG. 2 is a view corresponding to those shown in FIGS. 1A to 1C illustrating a comparative example of the method for adjusting the capacitance value of a built-in capacitor according to a preferred embodiment of the present invention.

FIG. 2 is a view illustrating a comparative example of the method for adjusting a built-in capacitor according to a preferred embodiment of the present invention. The view corresponds to FIGS. 1A to 1C. In FIG. 2, elements corresponding to those shown in FIGS. 1A to 1C are designated by the same reference numerals as those described above, and a duplicate description is omitted.

When the ratio of the $TiO_2$-based dielectric grains 9 in the $TiO_2$-based dielectric glass ceramic layer 4 is more than about 35 percent by volume, since the ratio of the $TiO_2$-based dielectric grains 9 becomes excessively large, when the dielectric grains 9 are semiconductorized, as shown in FIG. 2, the semiconductorized dielectric grains 9a are connected to each other between the first capacitor electrode 7 and the second capacitor electrode 8.

As a result, the first capacitor electrode 7 and the second capacitor electrode 8 are short-circuited by the laser trimming, and thus, the insulation resistance is significantly decreased. In addition, when the insulation properties of the dielectric glass ceramic layer 4 are degraded, loss of Joule heat occurs thereby, and the Q value of the capacitor decreases. The semiconductorized dielectric grains 9a can be returned to the original state by performing a re-oxidation treatment. However, the re-oxidation treatment is necessarily performed as an additional treatment, and in addition, the insulation resistance and the Q value of the built-in capacitor 2 are again changed by the re-oxidation treatment so that variations may occur.

As described above, according to preferred embodiments of the present invention, in the $TiO_2$-based dielectric glass ceramic layer 4, since the ratio of the $TiO_2$-based dielectric grains 9 is about 10 percent to about 35 percent by volume, the insulation resistance between the capacitor electrodes 7 and 8 and the Q value of the built-in capacitor 2 are not significantly changed before and after the laser trimming. In addition, without performing an additional treatment, such as a re-oxidation treatment, the capacitance value of the built-in capacitor 2 can be precisely adjusted.

In addition, the relative dielectric constant of the $TiO_2$-based dielectric glass ceramic layer 4 primarily depends on the volume ratio of the $TiO_2$-based dielectric grains 9 present therein, and when the ratio of the $TiO_2$-based dielectric grains 9 is less than about 10 percent by volume, and a sufficient relative dielectric constant $\in_r$ cannot be obtained in the dielectric glass ceramic layer 4 forming the built-in capacitor 2. For the reasons as described above, the volume ratio of the $TiO_2$-based dielectric grains 9 must be in the range of about 10% to about 35%, and preferably, the volume ratio is in the range of about 20% to about 35%. In addition, the grain diameter (D50) of the $TiO_2$-based dielectric grains 9 is preferably in the range of about 0.9 μm to about 2.5 μm, and more preferably in the range of about 1.0 μm to about 1.5 μm.

In addition, the layer thickness (element thickness) of the $TiO_2$-based dielectric glass ceramic layer 4 is preferably in the range of about 12.5 μm to about 50 μm. When the layer thickness is less than about 12.5 μm, even when the ratio of the $TiO_2$-based dielectric grains 9 is set as described above, the insulation resistance and/or the Q value may be changed in some cases before and after the laser trimming. In addition, when the layer thickness is more than about 50 μm, since the distance between the capacitor electrodes 7 and 8 is excessively large, it becomes difficult to obtain a high capacitance value of the built-in capacitor 2.

As for the locations of the first and the second capacitor electrodes 7 and 8, these two electrodes may be built in the ceramic laminate 6 as shown in FIG. 1. When the first capacitor electrode 7 to be processed by trimming is formed inside the ceramic laminate 6, as compared to the first capacitor electrode 7 being disposed on the surface of the ceramic laminate 6, laser light 10 having a large power must be irradiated. However, even if the laser light 10 having a large power is used, when the ratio of the $TiO_2$-based dielectric grains 9 in the $TiO_2$-based dielectric glass ceramic layer 4 is specified as described above, the capacitance value of the built-in capacitor 2 can be precisely adjusted without significantly changing the insulation resistance and the Q value.

In the multilayer ceramic substrate 1 described above, the ceramic layers 3 and 5 may be formed of a material similar to that for the $TiO_2$-based dielectric glass ceramic layer 4. However, another ceramic material having a low relative dielectric constant, such as a low-temperature sinterable ceramic (LTCC, Low Temperature Co-fired Ceramic) material, is preferably used. The low-temperature sinterable ceramic material is a ceramic material which can be sintered at a temperature of about 1,050° C. or less and which can be co-fired with silver, copper, or other suitable metal having a low specific resistance. As the low-temperature sinterable ceramic material, in particular, for example, a glass composite-based LTCC material formed by mixing a borosilicate glass with a powdered ceramic, such as alumina, zirconia, magnesia, or forsterite; a crystalline glass-based LTCC material using a $ZnO$—$MgO$—$Al_2O_3$—$SiO_2$-based crystalline glass; and a non-glass-based LTCC material such as a $BaO$—$Al_2O_3$—$SiO_2$-based powder ceramic or an $Al_2O_3$—$CaO$—$SiO_2$—$MgO$—$B_2O_3$-based powder ceramic may be used.

The $TiO_2$-based dielectric glass ceramic layer 4 preferably includes:

(A) about 10 percent to about 35 percent by volume of a $BaO$—$TiO_2$—$ReO_{3/2}$-based ceramic represented by $xBaO$-$yTiO_2$-$zReO_{3/2}$ (where x, y, and z each indicate molar percent; $8 \leq x \leq 18$, $52.5 \leq y \leq 65$, and $20 \leq z \leq 40$ hold; $x+y+z=100$ holds; and Re indicates a rare earth element);

(B) about 5 percent to about 42 percent by volume of an alumina ceramic; and (C) about 50 percent to about 79 percent by volume of a borosilicate glass which includes about 4 percent to about 17.5 percent by weight of $B_2O_3$, about 28 percent to about 50 percent by weight of $SiO_2$, about 0 percent to about 20 percent by weight of $Al_2O_3$, and about 36 percent to about 50 percent by weight of MO (where MO is at least one selected from the group consisting of CaO, MgO, SrO, and BaO), and the $TiO_2$-based dielectric glass ceramic layer is preferably formed by firing a glass ceramic composition containing the $BaO$—$TiO_2$—$ReO_{3/2}$-based ceramic and alumina in a total amount of at least about 21 percent by volume.

From the glass ceramic composition as described above, a sintered body can be formed to have a relatively high relative dielectric constant, and in addition, when a ceramic substrate incorporating a resistance element therein is formed, the resistance properties of the resistance element are not degraded.

In the above-described glass ceramic composition, the $BaO$—$TiO_2$—$ReO_{3/2}$-based ceramic represented by $xBaO$-$yTiO_2$-$zReO_{3/2}$ is formed into the $TiO_2$-based dielectric grains 9 by firing. In this glass ceramic composition, when the ratio of the alumina ceramic is less than about 5 percent by volume, the flexural strength of the multilayer ceramic substrate 1 after firing tends to decrease, and on the other hand, when the above ratio is more than about 42 percent by volume, since the ratio of the $BaO$—$TiO_2$—$ReO_{3/2}$-based ceramic decreases, a relative dielectric constant necessary as the built-in capacitor 2 may not be obtained.

In addition, when the ratio of the borosilicate glass is less than about 50 percent by volume, the sintering properties of the multilayer ceramic substrate 1 may be insufficient, and on the other hand, when the above ratio is more than about 79 percent by volume, since the ratio of the $BaO$—$TiO_2$—$ReO_{3/2}$-based ceramic decreases, a relative dielectric constant necessary as the built-in capacitor 2 may not be obtained.

In addition, when the total amount of the $BaO$—$TiO_2$—$ReO_{3/2}$-based ceramic and the alumina ceramic is less than about 21 percent by volume, since the ratio of the $BaO$—$TiO_2$—$ReO_{3/2}$-based ceramic decreases, a relative dielectric constant necessary as the built-in capacitor 2 may not be obtained, and in addition, the flexural strength also tends to decrease.

In addition, as described in detail in PCT International Publication No. WO2006/046361 Pamphlet by the inventors of the present invention, in the $BaO$—$TiO_2$—$ReO_{3/2}$-based ceramic represented by $xBaO$-$yTiO_2$-$zReO_{3/2}$, when x is less than about 8, the relative dielectric constant and the Q values decrease, and the absolute value of a temperature coefficient of capacitance (TCC) of the relative dielectric constant may increase. On the other hand, when x is more than about 18, the Q value decreases, and the absolute value of TCC also tends to increase. In addition, when y is less than about 52.5, the relative dielectric constant may decrease in some cases, and on the other hand, when y is more than about 65, the absolute value of TCC tends to increase. In addition, when z is less than about 20, the absolute value of TCC may increase, and on the other hand, when z is more than about 40, the absolute value of TCC increases and the relative dielectric constant also tends to decrease. In addition, as Re (rare earth element), Nd, Pr, Sm, or other suitable element may be used.

In the borosilicate glass, when the content of $B_2O_3$ is less than about 4 percent by weight, the sintering properties may become insufficient, and on the other hand, when the content is more than about 17.5 percent by weight, since the humidity resistance is degraded, PCT (Pressure Cooker Test) reliability is degraded, and dielectric breakdown may occur. In addition, when the content of $SiO_2$ is less than about 28 percent by weight, the humidity resistance is degraded, the PCT reliability is degraded, and dielectric breakdown may occur. On the other hand, when the content of $SiO_2$ is more than about 50 percent by weight, the sintering properties tend to be insufficient.

In addition, in the borosilicate glass, $Al_2O_3$ may not be included. However, $Al_2O_3$ is preferably included since the humidity resistance is improved. When the content of $Al_2O_3$ is more than about 20 percent by weight, the Q value tends to decrease.

In addition, in the borosilicate glass, when the content of MO is less than about 36 percent by weight, the sintering properties may be insufficient, and on the other hand, when the content is more than about 50 percent by weight, the humidity resistance is degraded, the PCT reliability is degraded, and dielectric breakdown may occur. Although at least one selected from the group consisting of CaO, MgO, SrO, and BaO may be used as MO, in order to obtain a high Q value of the dielectric glass ceramic layer 4, CaO is preferably used.

In addition, the borosilicate glass preferably further includes at least one selected from the group consisting of $Li_2O$, $Na_2O$, and $K_2O$ in an amount of less than about 0.5 percent by weight. When at least one of these alkali metal oxides is included in the range described above, a high relative dielectric constant is obtained. When the content of the alkali metal oxide is more than about 0.5 percent by weight, the humidity resistance tends to be degraded.

The above glass ceramic composition may further include about 20 percent by weight or less of $CaTiO_3$. When $CaTiO_3$ in the range described above is included, a high relative dielectric constant is obtained. In addition, when the content of $CaTiO_3$ is more than about 20 percent by weight, the absolute value of TCC tends to increase.

In addition, the glass ceramic composition may further include about 3 parts by weight or less of $CeO_2$ with respect to 100 parts by weight of the total of the $BaO$—$TiO_2$—$ReO_{3/2}$-based ceramic, the alumina ceramic, and the borosilicate glass. When $CeO_2$ is included in the range described above, and Ag is used as an electrode material, discoloration of a portion of a substrate in the vicinity of the electrode, which is caused by colloid formation of Ag used as an electrode material, can be suppressed. In addition, when the content of $Ce_2O$ is more than about 3 percent by weight, the Q value of the dielectric glass ceramic layer tends to decrease.

In addition, when at least one of $TiO_2$ and $ZrO_2$ in an amount of about 1 percent by weight or less is added to the glass ceramic composition, the absolute value of the rate of change in temperature of relative dielectric constant of a sintered body can be decreased which is obtained by sintering the above composition. Since this $TiO_2$ is to be included in the $TiO_2$-based dielectric grains 9 of the $TiO_2$-based dielectric glass ceramic layer 4 after the firing, depending on the ratio of the grains formed of this $TiO_2$, the amount of the $TiO_2$-based dielectric grains 9 must be adjusted within the range described above.

Next, an example of the multilayer ceramic substrate according to a preferred embodiment of the present invention and a method for manufacturing the same will be described.

Figure 3:
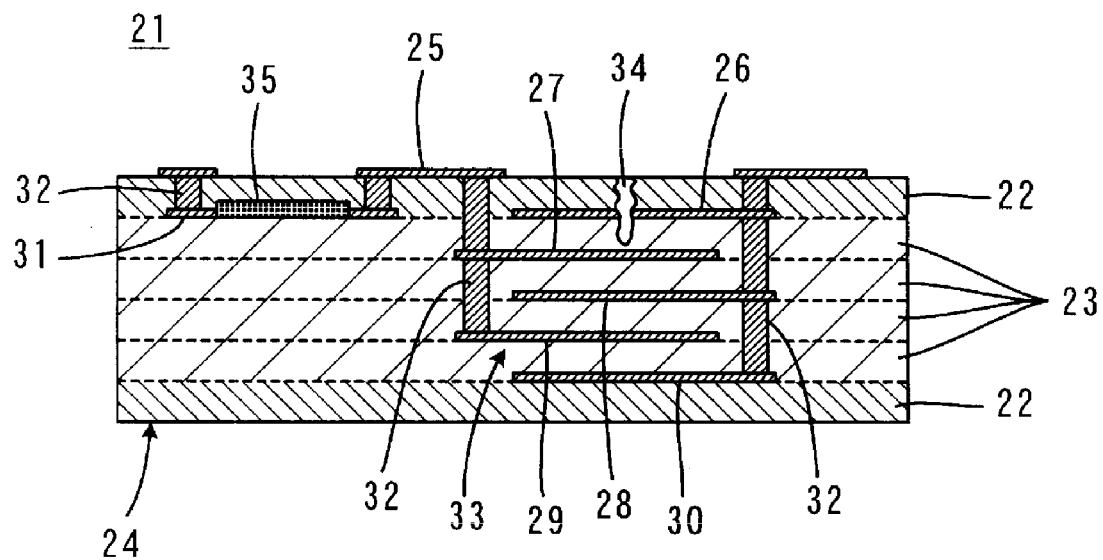
FIG. 3 is a cross-sectional view schematically showing a multilayer ceramic substrate of one preferred embodiment according to the present invention.

As shown in FIG. 3, a multilayer ceramic substrate 21 includes a ceramic laminate 24 including ceramic layers 22 and ceramic layers 23 laminated to each other. Each of the ceramic layers 22 is a ceramic layer formed of the low-temperature sinterable ceramic material described above, and the ceramic layers 23 are each the $TiO_2$-based dielectric glass ceramic layer described above.

Conductive patterns primarily formed, for example, of Ag or Cu are provided on the ceramic layers 22 and 23. As the conductive patterns, there are several external conductors 25 formed on the external surface of the multilayer ceramic substrate 21, several interlayer conductors 26 to 31 formed along interfaces between the ceramic layers 22 and 23, and several via hole conductors 32 provided to penetrate specific layers of the ceramic layers 22 and 23.

Among the conductive patterns 25 to 32, besides patterns provided simply as wires, patterns are provided to define at least one passive element, such as a capacitor and/or an inductor, inside the multilayer ceramic substrate 21. For example, the interlayer conductors 26 to 30 are to be formed into capacitor electrodes. From the capacitor electrodes 26 to 30 and the ceramic layers 23 disposed therebetween, a built-in capacitor 33 is formed. It is understood that a built-in capacitor may be formed of at least three capacitor electrodes as well as of two capacitor electrodes. At least one of the capacitor electrodes 26 to 30 may also be used as a ground electrode.

In this multilayer ceramic substrate 21, a trimming track 34 is formed by the above method for adjusting the capacitance value of the built-in capacitor 33. This trimming track 34 is formed by performing laser trimming of the capacitor electrode 26 from one primary surface side of the multilayer ceramic substrate 21 obtained by a general sheet lamination method or a thick film printing lamination method. In addition, the trimming track 34 may be filled with a glass or a resin in order to prevent variations in the capacitance which may occur after the capacitance adjustment is performed.

In addition, a thick film resistor 35 is built in the multilayer ceramic substrate 21. The thick film resistor 35 includes a resistor film provided along the interface between the ceramic layers 22 and 23. This resistor film is formed by sintering a resistor paste including, for example, $RuO_2$ as a primary component and a silicate-based glass as an auxiliary component. When this thick film resistor 35 is processed by laser trimming to adjust the resistor value thereof, even if the ceramic layer 23 is partially milled, since the ceramic layer 23 is formed of the $TiO_2$-based dielectric glass ceramic layer described above, changes in properties before and after the trimming are minimal.

Figure 4:
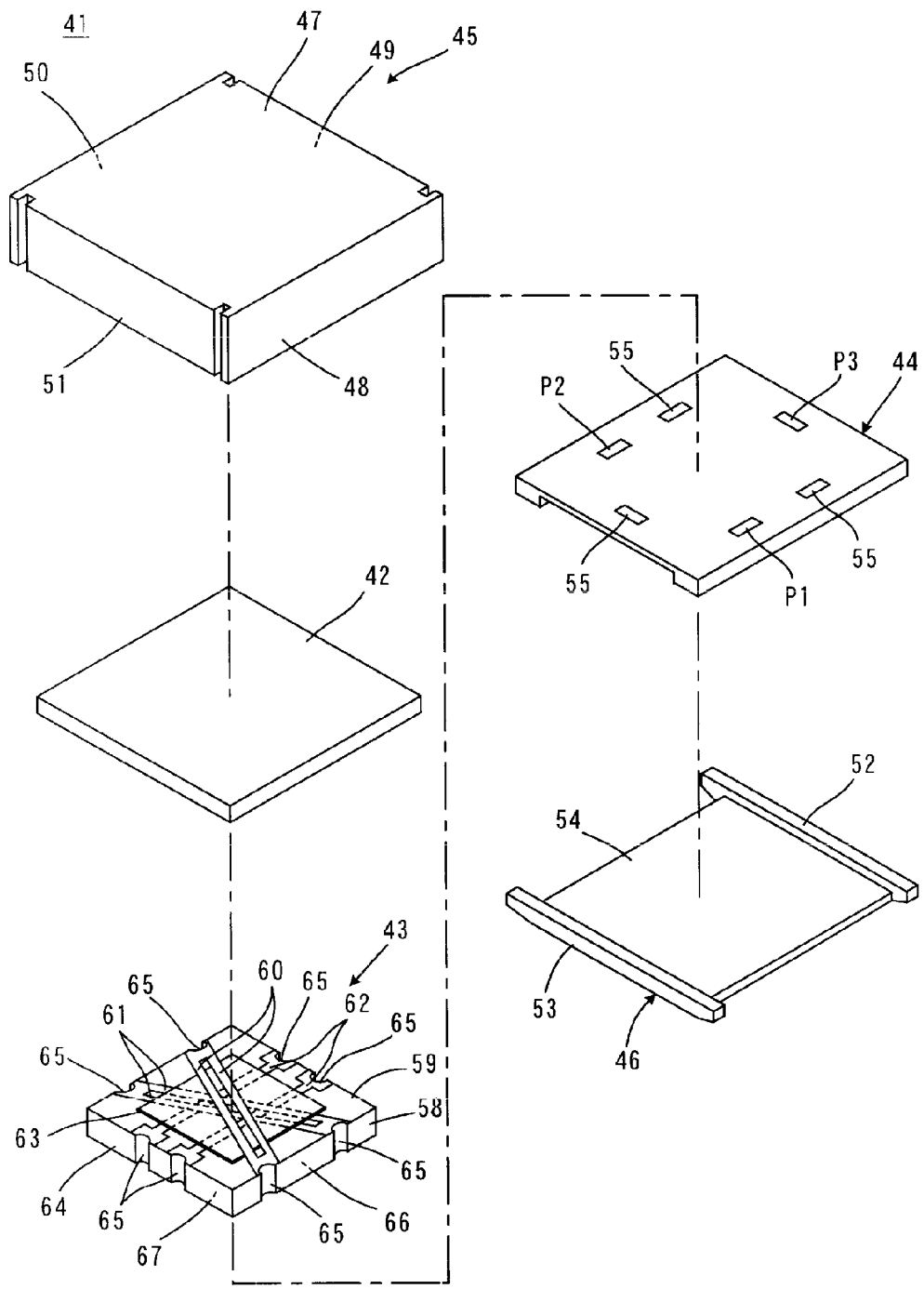
FIG. 4 is an exploded perspective view of a lumped-constant isolator as one example of a nonreciprocal circuit device having a multilayer ceramic substrate according to another preferred embodiment of the present invention.
Figure 5:
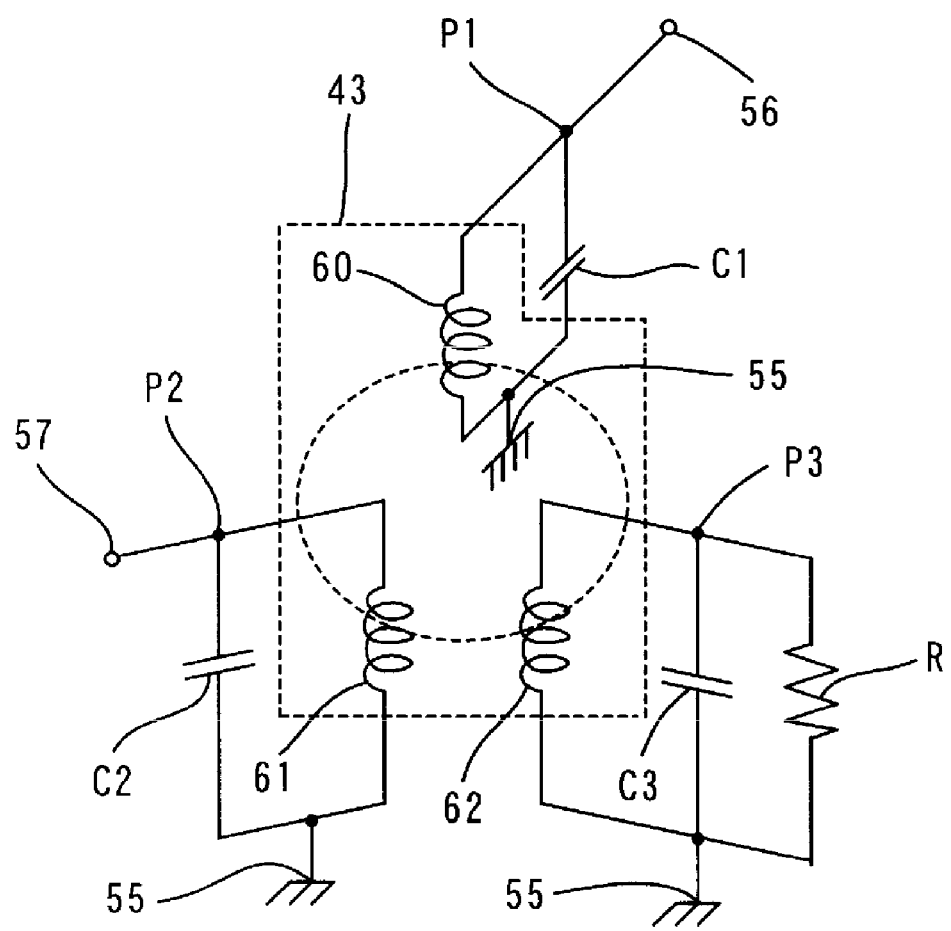
FIG. 5 is an equivalent circuit of the lumped-constant isolator shown in FIG. 4.

Next, one example of an electronic component formed by using the multilayer ceramic substrate according to a preferred embodiment of the present invention will be described with reference to FIGS. 4 and 5. FIG. 4 is an exploded perspective view showing a lumped-constant isolator 41 as an example of a nonreciprocal circuit device, and FIG. 5 is an equivalent circuit of the lumped-constant isolator 41.

As shown in FIG. 4, the lumped-constant isolator 41 includes a rectangular permanent magnet 42, a central electrode assembly 43, a mounting multilayer ceramic substrate 44, an upper side casing 45, and a lower side casing 46, the latter two casings each defining a metal casing.

The upper side casing 45 has a box shape having an opening facing downward and includes an upper wall portion 47 and four side wall portions 48 to 51. The lower side casing 46 includes two standing walls 52 and 53 facing each other and a bottom wall portion 54 extending between the standing walls 52 and 53. The upper side casing 45 and the lower side casing 46 are each formed of a ferromagnetic material, and the surfaces thereof are processed by Ag or Cu plating.

Hereinafter, with reference to FIG. 5 together with FIG. 4, the central electrode assembly 43 and the multilayer ceramic substrate 44 will be described in detail.

Although a mechanical structure of the multilayer ceramic substrate 44 is not shown in the figures, the multilayer ceramic substrate 44 has a multilayer structure which includes ceramic layers laminated to each other and which incorporates matching capacitor elements C1, C2, and C3 and a resistor element R as shown in FIG. 5. The built-in structures of the matching capacitor elements C1 to C3 and the resistor element R are substantially the same as those of the built-in capacitor 33 and the thick film resistor 35 in the multilayer ceramic substrate 21 shown in FIG. 3. In addition, although not shown in the FIG. 4, the multilayer ceramic substrate 44 includes trimming tracks of these passive elements.

On the upper surface of the multilayer ceramic substrate 44, port electrodes P1, P2, and P3 and ground electrodes 55 are exposed. Although not being shown in FIG. 4, on the lower surface of the multilayer ceramic substrate 44, an input electrode 56 and an output electrode 57 electrically connecting this isolator 41 to an external circuit are provided.

The central electrode assembly 43 has a substantially rectangular base 58 made of microwave ferrite. Central electrodes 60, 61, and 62 are disposed on an upper surface 59 of the base 58. These central electrodes 60 to 62 are insulated from each other by electrical insulating layers 63 provided therebetween. In addition, the three central electrodes 60 to 62 are arranged so as to cross each other with an angle of approximately 120°.

Although the order of placement of the central electrodes 60 to 62 may be arbitrarily determined, in the preferred embodiment shown in FIG. 4, the central electrode 62, the electrical insulating layer 63, the central electrode 61, the electrical insulating layer 63, and the central electrode 60 are disposed in that order from the bottom. One-side end of each of the central electrodes 60 to 62 is connected to a ground electrode 67 provided on a lower surface 66 of the base 58 through connection electrodes 65 provided on side surfaces 64 of the base 58, and the other-side ends of these central electrodes 60 to 62 are connected to the port electrodes P1 to P3 of the multilayer ceramic substrate 44 through the connection electrodes 65 provided on the side surfaces 64.

As described above, the ground sides of the central electrodes 60 to 62 are connected to the common ground electrode 67 through the connection electrodes 65. This common ground electrode 67 has a shape approximately the same as that of the lower surface 66 of the base 58 and covers almost an entire surface of the lower surface 66 so as not to be in contact with the port electrodes P1 to P3 provided on the multilayer ceramic substrate 44. In addition, the ground electrode 67 is connected to the ground electrodes 55 on the multilayer ceramic substrate 44.

When the lumped-constant isolator 41 includes the elements described above, first, the multilayer ceramic substrate 44 is disposed in the lower side casing 46, and the central electrode assembly 43 is disposed on the multilayer ceramic substrate 44, so that a predetermined electrical connection is provided. In addition, the permanent magnet 42 is disposed at the lower surface side of the upper wall portion 47 of the upper side casing 45. Subsequently, while this arrangement is maintained, the upper side casing 45 and the lower side casing 46 are connected to each other, so that a united metal casing is formed.

When the elements are assembled as described above, the permanent magnet 42 applies a direct current magnetic field to the central electrode assembly 43. In this case, the metal casing including the upper side casing 45 and the lower side casing 46 defines a magnetic circuit and also functions as a yoke.

As described above, the multilayer ceramic substrate and the method for manufacturing the same according to preferred embodiments of the present invention may be used in a nonreciprocal circuit device and a method for manufacturing the same. The nonreciprocal circuit device includes a permanent magnet, a central electrode assembly which has a base, a plurality of central electrodes disposed on the base to cross each other with a predetermined crossing angle, and electrical insulating layers disposed between the central electrodes to electrically insulate the central electrodes from one another, and which is applied with a direct current magnetic field by the permanent magnet, a casing accommodating the permanent magnet and the central electrode assembly, and a multilayer ceramic substrate mounting the central electrode assembly and provided with a capacitor element and a resistor element.

The multilayer ceramic substrate and the method for manufacturing the same according to preferred embodiments of the present invention may also be applied to various modular ceramic substrates and a method for manufacturing the same.

In addition, the capacitance adjustment by laser trimming is not limited to the milling a portion of the first capacitor electrode, that is, not limited to capacitance adjustment by decreasing an electrode area, and for example, the capacitance adjustment may be performed by dividing one first capacitor electrode into at least two portions. In addition, trimming of the second capacitor electrode may be simultaneously performed when laser trimming is performed for the first capacitor electrode.

Next, the present invention will be described in detail with reference to experimental examples. However, the present invention is not limited to the following experimental examples.

Experimental Example 1

First, in order to form a powdered $BaO$—$TiO_2$—$ReO_{3/2}$-based ceramic, $BaCO_3$, $TiO_2$, $Nd_2O_3$, and $Sm_2O_3$ powders were mixed together at a ratio, on a molar percent basis, of about 13%, about 58%, about 10%, and about 19%, respectively. Next, after a powdered starting material obtained by mixing was calcined for about 1 hour at a temperature of about 1,150° C., the calcined product was pulverized, so that the powdered $BaO$—$TiO_2$—$ReO_{3/2}$-based ceramic (hereinafter referred to as a "BRT powder" or a "$BaO$—$Re_2O_3$-$4TiO_2$-based ceramic powder" in some cases) was obtained.

Next, in order to form a powdered borosilicate glass, CaO, $Al_2O_3$, $B_2O_3$, and $SiO_2$ powders were mixed together at a ratio, on a weight percent basis, of about 45%, about 5%, about 5%, and about 45%, respectively. Subsequently, after a powdered starting material obtained by mixing was melted at a temperature of about 1,100° C. to about 1,400° C. and was then charged into water for quenching, and wet pulverization was performed so that a powdered borosilicate glass was obtained.

Next, by using the powdered $BaO$—$TiO_2$—$ReO_{3/2}$-based ceramic, a powdered $Al_2O_3$ ceramic, and the powdered borosilicate glass, in order to obtain the composition ratio shown in the column "glass ceramic composition" in terms of the volume ratio after firing, these specific powdered ceramic and glass were weighed and were then mixed together.

Subsequently, to the mixed powder obtained as described above, appropriate amounts of a binder, a plasticizer, and a solvent were added, followed by kneading, so that a slurry was obtained. Next, the slurry was formed by a doctor blade method into a sheet having a thickness of about 50 μm. The obtained ceramic green sheet was cut into substantially rectangular sheets having a size of about 30 mm by about 10 mm. Next, the substantially rectangular ceramic green sheets were laminated and pressure-bonded to each other, so that laminates having a thickness of about 0.5 mm to about 1.0 mm were obtained.

In addition, in order to form a capacitor electrode pattern having a planar dimension of about 1 mm by about 1 mm used as the first capacitor electrode at a location spaced from a surface layer by about 0.05 mm and a capacitor electrode pattern having a planar dimension of about 1 mm by about 1 mm used as the second capacitor electrode at a location spaced from the surface layer by about 0.10 mm inside the laminate described above, conductive films were formed by applying a Ag paste on the ceramic green sheets before the lamination step was performed.

Next, the laminates thus obtained were fired at a temperature of about 870° C. for about 1 hour, so that plate-shaped sintered bodies of Samples 1 to 25 were obtained.

Subsequently, the sintered bodies were each processed using a YAG laser to irradiate the first capacitor electrode with laser light at an output of about 2 kHz with a scan number of about 7 (conditions of laser trimming), so that the first capacitor electrode was trimmed to decrease the capacitor's capacitance from about 20 pF to about 10 pF.

Next, the insulation resistances (logIR) before and after the trimming were respectively measured, and using an LCR meter, the Q values at about 1 MHz before and after the trimming were also respectively measured. In addition, the relative dielectric constant $\epsilon_r$ of the dielectric glass ceramic layer after the trimming was measured with an LCR meter, and the flexural strength (MPa) of the dielectric glass ceramic layer after the trimming was also measured.

The results obtained by the individual measurements are shown in Table 1. In addition, in the column "judgment of trimming performance" in Table 1, "G" indicates that the rates of change in the insulation resistance and the Q value before and after trimming are about 30% or less, and "NG" indicates that the rates of change in the insulation resistance and the Q value before and after trimming are more than about 30%. In addition, FIG. 6 is a graph showing the rates of change in insulation resistance and Q value with respect to the content (volume percent) of the $BaO$—$Re_2O_3$-$4TiO_2$-based ceramic.

TABLE 1

| | GLASS CERAMIC COMPOSITION | | | INSULATION RESISTANCE (logIR) | | |
|---|---|---|---|---|---|---|
| | BRT | $Al_2O_3$ | GLASS | | | |
| SAMPLE NO. | (VOLUME PERCENT) | (VOLUME PERCENT) | (VOLUME PERCENT) | BEFORE TRIMMING | AFTER TRIMMING | RATE OF CHANGE (%) |
| 1 | 5.0 | 32.0 | 63.0 | 13.13 | 12.81 | 102.5 |
| 2 | 10.0 | 5.0 | 85.0 | 12.78 | 12.91 | 99.0 |
| 3 | 10.0 | 11.0 | 79.0 | 13.45 | 11.83 | 113.7 |
| 4 | 10.0 | 24.9 | 65.1 | 12.86 | 12.99 | 99.0 |
| 5 | 10.0 | 40.0 | 50.0 | 12.75 | 11.85 | 107.6 |
| 6 | 10.0 | 50.0 | 40.0 | 12.38 | 12.41 | 99.8 |
| 7 | 17.0 | 15.1 | 67.9 | 13.24 | 12.29 | 107.7 |
| 8 | 17.0 | 27.0 | 56.0 | 13.12 | 12.88 | 101.9 |
| 9 | 20.2 | 10.6 | 69.2 | 12.91 | 12.77 | 101.1 |
| 10 | 23.5 | — | 76.5 | 12.52 | 12.50 | 100.2 |
| 11 | 23.5 | 5.9 | 70.6 | 13.25 | 12.87 | 103.0 |
| 12 | 23.5 | 18.5 | 58.0 | 12.85 | 11.99 | 107.2 |
| 13 | 23.5 | 26.5 | 50.0 | 12.93 | 12.70 | 101.8 |
| 14 | 23.5 | 31.5 | 45.0 | 12.70 | 12.44 | 102.1 |
| 15 | 26.0 | 2.4 | 71.6 | 12.54 | 12.13 | 103.4 |
| 16 | 28.0 | 5.0 | 67.0 | 13.05 | 12.09 | 107.9 |
| 17 | 28.0 | 22.0 | 50.0 | 13.50 | 13.18 | 102.4 |
| 18 | 31.0 | — | 69.0 | 12.85 | 13.06 | 98.4 |
| 19 | 31.0 | 5.9 | 63.1 | 11.87 | 12.05 | 98.5 |
| 20 | 35.0 | — | 65.0 | 12.35 | 11.89 | 103.9 |
| 21 | 35.0 | 10.0 | 55.0 | 12.35 | 11.93 | 103.5 |
| 22 | 35.0 | 20.0 | 45.0 | 12.74 | 13.13 | 97.0 |
| 23 | 40.3 | — | 59.7 | 11.93 | 7.57 | 157.6 |
| 24 | 51.2 | — | 48.8 | 8.69 | 6.53 | 133.1 |
| 25 | 65.0 | — | 35.0 | 12.23 | 6.02 | 203.2 |

| | Q VALUE at 1 MHz | | | JUDGMENT OF TRIMMING PERFORMANCE | RELATIVE DIELECTRIC CONSTANT $\epsilon_r$ | FLEXURAL STRENGTH (MPa) |
|---|---|---|---|---|---|---|
| SAMPLE NO. | BEFORE TRIMMING | AFTER TRIMMING | RATE OF CHANGE (%) | | | |
| 1 | 1236 | 1251 | 98.8 | G | 8.5 | 312 |
| 2 | 1324 | 1319 | 100.4 | G | 8.1 | 283 |
| 3 | 1351 | 1326 | 101.9 | G | 10.4 | 293 |
| 4 | 1398 | 1371 | 102.0 | G | 11.6 | 301 |
| 5 | 1363 | 1350 | 101.0 | G | 10.7 | 308 |
| 6 | 1313 | 1295 | 101.4 | G | 8.9 | 286 |
| 7 | 1410 | 1425 | 98.9 | G | 13.2 | 282 |
| 8 | 1384 | 1309 | 105.7 | G | 13.5 | 290 |
| 9 | 1461 | 1458 | 100.2 | G | 15.1 | 287 |
| 10 | 1444 | 1419 | 101.8 | G | 16.6 | 255 |
| 11 | 1500 | 1491 | 100.6 | G | 16.9 | 281 |
| 12 | 1456 | 1435 | 101.5 | G | 17.2 | 286 |
| 13 | 1482 | 1421 | 104.3 | G | 16.8 | 282 |
| 14 | 1465 | 1409 | 104.0 | G | 17.0 | 291 |
| 15 | 1498 | 1501 | 99.8 | G | 18.2 | 264 |
| 16 | 1521 | 1485 | 102.4 | G | 19.2 | 283 |
| 17 | 1489 | 1467 | 101.5 | G | 19.1 | 297 |
| 18 | 1479 | 1460 | 101.3 | G | 20.0 | 261 |
| 19 | 1514 | 1397 | 108.4 | G | 19.6 | 290 |
| 20 | 1484 | 1183 | 125.4 | G | 20.8 | 265 |
| 21 | 1436 | 1258 | 114.1 | G | 21.3 | 282 |
| 22 | 1442 | 1233 | 117.0 | G | 20.9 | 305 |
| 23 | 1477 | 684 | 215.9 | NG | 23.3 | 259 |
| 24 | 1493 | 425 | 351.3 | NG | 25.8 | 253 |
| 25 | 1478 | 388 | 380.9 | NG | 30.1 | 251 |

As shown in Table 1 and FIG. 6, according to Samples 2 to 22 in which the content of the BaO—$Re_2O_3$-4$TiO_2$-based ceramic was within about 10 percent to about 35 percent by volume, although a relatively high relative dielectric constant was obtained, the rates of change in the insulation resistance and the Q value before and after the trimming were approximately 100%, that is, the insulation resistance and the Q value were not significantly changed before and after the trimming.

On the other hand, in Sample 1, since the content of the BaO—$Re_2O_3$-4$TiO_2$-based ceramic was too low, although the insulation resistance and the Q value before and after the trimming were not significantly changed, a sufficient relative dielectric constant could not be obtained as the dielectric glass ceramic layer. In addition, in Samples 23 to 25, since the $Al_2O_3$ ceramic was not included and the content of the BaO—$Re_2O_3$-4$TiO_2$-based ceramic was too high, although a sufficient relative dielectric constant could be obtained as the dielectric glass ceramic layer, the flexural strength was decreased, and in addition, the insulation resistance and the Q value were significantly changed before and after the trimming.

Next, it was found that as Sample 2 among Samples 2 to 22, when the total content of the BaO—$Re_2O_3$-4$TiO_2$-based ceramic and the $Al_2O_3$ ceramic was low and the content of the borosilicate glass was high, the relative dielectric constant decreased. In addition, although not shown in Table 1, it was found that as Sample 6, when the content of the $Al_2O_3$ ceramic was high and the content of the borosilicate glass was low, sufficient sintering was not likely to be performed at this firing temperature. In addition, it was also found that as Samples 10, 15, 18, and 20, when the $Al_2O_3$ ceramic was not included, or the content thereof was low, the flexural strength was decreased. In addition, it was also found that as Samples 14 and 22, when the content of the borosilicate glass was low, sufficient sintering was not likely to be performed at this firing temperature.

Experimental Example 2

Next, by using the composition of Sample 9 of Experimental Example 1, the thickness (element thickness) of the dielectric glass ceramic layer between the capacitor electrodes was changed as shown in Table 2 and, in a manner similar to that in Experimental Example 1, the insulation resistance and the Q value were measured before and after the trimming. The results obtained by the above measurements are shown in the following Table 2.

before and after the trimming tended to increase, and in particular, when the element thickness was less than about 12.5 μm, the rates of change in the insulation resistance and the Q value before and after the trimming significantly increased.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A method for adjusting a capacitance value of a built-in capacitor of a multilayer ceramic substrate, the method comprising the steps of:
    forming the multilayer ceramic substrate to include a ceramic laminate including a plurality of ceramic layers laminated to each other and first and second capacitor electrodes arranged to face each other with one of the plurality of ceramic layers interposed therebetween so as to define the built-in capacitor; and
    performing laser trimming of the first capacitor electrode; wherein
    the one of the plurality of ceramic layers interposed between the first and second electrodes is a $TiO_2$-based dielectric glass ceramic layer which includes about 10 percent to about 35 percent by volume of dielectric grains including $TiO_2$;
    the $TiO_2$-based dielectric glass ceramic layer includes:
    (A) about 10 percent to about 35 percent by volume of a BaO—$TiO_2$—$ReO_{3/2}$-based ceramic represented by xBaO-y$TiO_2$-z$ReO_{3/2}$, where x, y, and z each indicate molar percent; 8≦x≦18, 52.5≦y≦65, and 20≦z≦40 hold; x+y+z=100 holds; and Re indicates a rare earth element;
    (B) about 5 percent to about 42 percent by volume of an alumina ceramic; and
    (C) about 50 percent to about 79 percent by volume of a borosilicate glass which includes about 4 percent to about 17.5 percent by weight of $B_2O_3$, about 28 percent to about 50 percent by weight of $SiO_2$, about 0 percent to about 20 percent by weight of $Al_2O_3$, and about 36 percent to about 50 percent by weight of MO, where MO is at least one selected from the group consisting of CaO, MgO, SrO, and BaO; and
    the $TiO_2$-based dielectric glass ceramic layer is formed by firing a glass ceramic composition including the BaO—$TiO_2$—$ReO_{3/2}$-based ceramic and the alumina ceramic in a total amount of at least about 21 percent by volume.

2. The method for adjusting the capacitance value of a built-in capacitor according to claim 1, wherein the $TiO_2$-

TABLE 2

| SAMPLE NO. | ELEMENT THICKNESS (μm) | INSULATION RESISTANCE (logIR) | | | Q VALUE at 1 MHz | | |
|---|---|---|---|---|---|---|---|
| | | BEFORE TRIMMING | AFTER TRIMMING | RATE OF CHANGE | BEFORE TRIMMING | AFTER TRIMMING | RATE OF CHANGE |
| 31 | 5.0 | 13.01 | 5.86 | 222.0% | 2126 | 403 | 527.5% |
| 32 | 10.0 | 12.88 | 8.19 | 157.3% | 1950 | 931 | 209.5% |
| 33 | 12.5 | 12.91 | 11.89 | 108.6% | 1876 | 1789 | 104.9% |
| 34 | 25.0 | 12.91 | 12.77 | 101.1% | 1461 | 1458 | 100.2% |
| 35 | 50.0 | 11.75 | 11.33 | 103.7% | 1198 | 1201 | 99.8% |

As shown in Table 2, as the element thickness decreased, the rates of change in the insulation resistance and the Q value based dielectric glass ceramic layer has a layer thickness of about 12.5 μm to about 50 μm.

3. The method for adjusting the capacitance value of a built-in capacitor according to claim 1, wherein the first and the second capacitor electrodes are both built in the ceramic laminate.

4. The method for adjusting the capacitance value of a built-in capacitor according to claim 1, wherein the borosilicate glass further includes less than about 0.5 percent by weight of at least one selected from the group consisting of $Li_2O$, $Na_2O$, and $K_2O$.

5. A method for manufacturing a multilayer ceramic substrate comprising the steps of:
   forming a multilayer ceramic substrate before being processed by trimming, which includes a ceramic laminate having a plurality of ceramic layers laminated to each other, and first and second capacitor electrodes arranged to face each other with one of the plurality of ceramic layers interposed therebetween so as to define a built-in capacitor; and
   performing laser trimming of the first capacitor electrode in order to adjust the capacitance value of the built-in capacitor; wherein
   in the step of forming a multilayer ceramic substrate before being processed by trimming, the one of the plurality of ceramic layers interposed between the first and second capacitor electrodes is formed of a $TiO_2$-based dielectric glass ceramic layer in which the content of dielectric grains including $TiO_2$ is about 10 percent to about 35 percent by volume;
   the $TiO_2$-based dielectric glass ceramic layer includes:
   (A) about 10 percent to about 35 percent by volume of a $BaO$—$TiO_2$—$ReO_{3/2}$-based ceramic represented by $xBaO\text{-}yTiO_2\text{-}zReO_{3/2}$, where x, y, and z each indicate molar percent; $8 \leq x \leq 18$, $52.5 \leq y \leq 65$, and $20 \leq z \leq 40$ hold; $x+y+z=100$ holds; and Re indicates a rare earth element;
   (B) about 5 percent to about 42 percent by volume of an alumina ceramic; and
   (C) about 50 percent to about 79 percent by volume of a borosilicate glass which includes about 4 percent to about 17.5 percent by weight of $B_2O_3$, about 28 percent to about 50 percent by weight of $SiO_2$, about 0 percent to about 20 percent by weight of $Al_2O_3$, and about 36 percent to about 50 percent by weight of MO, where MO is at least one selected from the group consisting of CaO, MgO, SrO, and BaO; and
   the $TiO_2$-based dielectric glass ceramic layer is formed by firing a glass ceramic composition including the $BaO$—$TiO_2$—$ReO_{3/2}$-based ceramic and the alumina ceramic in a total amount of at least about 21 percent by volume.

6. The method for manufacturing a multilayer ceramic substrate according to claim 5, wherein the $TiO_2$-based dielectric glass ceramic layer has a layer thickness of about 12.5 μm to about 50 μm.

7. The method for manufacturing a multilayer ceramic substrate according to claim 5, wherein the first and the second capacitor electrodes are both built in the ceramic laminate.

8. The method for manufacturing a multilayer ceramic substrate according to claim 5, wherein the borosilicate glass further includes less than about 0.5 percent by weight of at least one selected from the group consisting of $Li_2O$, $Na_2O$, and $K_2O$.

* * * * *